United States Patent [19]
Zagar

[11] Patent Number: 5,148,391
[45] Date of Patent: Sep. 15, 1992

[54] NONVOLATILE, ZERO-POWER MEMORY CELL CONSTRUCTED WITH CAPACITOR-LIKE ANTIFUSES OPERABLE AT LESS THAN POWER SUPPLY VOLTAGE

[75] Inventor: Paul S. Zagar, Boise, Id.

[73] Assignee: Micron Technology, Inc., Boise, Id.

[21] Appl. No.: 837,175

[22] Filed: Feb. 14, 1992

[51] Int. Cl.$^5$ .............................................. G41C 17/00
[52] U.S. Cl. ...................................... 365/96; 365/102;
    365/189.11; 307/222.1; 307/451; 307/475
[58] Field of Search ...................... 307/202.1, 451, 475;
    365/96, 102, 225.7, 189.11

[56] References Cited

U.S. PATENT DOCUMENTS

| | | | |
|---|---|---|---|
| 5,065,048 | 11/1991 | Asai et al. | 307/451 |
| 5,068,553 | 11/1991 | Love | 307/451 |
| 5,099,149 | 3/1992 | Smith | 307/202.1 |
| 5,113,097 | 5/1992 | Lee | 307/475 |

Primary Examiner—Joseph E. Clawson, Jr.
Attorney, Agent, or Firm—Angus C. Fox, III

[57] ABSTRACT

This disclosure describes a nonvolatile zero-power memory cell circuit constructed from anti-fuses operable at less than full power supply voltage, and which provides full CMOS output voltage levels. The cell comprises a programmable node which is connected to a high voltage line (which during normal operation is at a potential of approximately $V_{cc}/2$) via a first antifuse and to a low voltage line (which during normal operation is at ground potential) via a second antifuse. The programmable node is connectable to ground via a field-effect transistor which is controlled by a programming signal. The programmable node may be permanently connected to the high-voltage line by activating the programming signal and raising the voltage on that line to a voltage that is sufficiently high to cause the dielectric of the first antifuse to short. On the other hand, the programmable node may be permanently connected to the low-voltage line by activating the programming signal and raising the voltage on that line to a voltage level that is sufficiently high to cause the dielectric of the second antifuse to short. In order to provide a CMOS compatible outut, the voltage at the programmable node is fed to either a simple voltage translator or to a latched circuit, either of which boosts $V_{cc}/2$ outputs to $V_{cc}$ (the required voltage for CMOS operation).

31 Claims, 4 Drawing Sheets

NONVOLATILE, ZERO-POWER MEMORY CELL CONSTRUCTED WITH CAPACITOR-LIKE ANTIFUSES OPERABLE AT LESS THAN POWER SUPPLY VOLTAGE

FIELD OF THE INVENTION

This invention relates to non-volatile programmable memory cells constructed with capacitor-like antifuses, and particularly those cells having antifuses designed to operate at less than power supply voltage. Such cells can be utilized to construct programmable logic devices featuring low programming voltages, or to implement row and column redundancy in dynamic random access memory arrays using a process in which the antifuse dielectric layer is optimized for the DRAM cell capacitor dielectric layer, thus requiring a voltage translator circuit to maximum intermediate output voltages used in the antifuse portion of the nonvolatile memory cell to a level compatible with standard CMOS logic circuitry.

BACKGROUND OF THE INVENTION

Folded bitline architecture has, for years, been the standard for the dynamic random access memory (DRAM) arrays. Because reliable operation of a DRAM array having a folded bitline architecture requires that the capacitors of individual DRAM cells see a maximum of no more than half the power supply voltage across the capacitor plates, optimum cell capacitance can be achieved by utilizing a capacitor dielectric layer having a thickness that reliably withstands breakdown voltages of only slightly more than half the power supply voltage.

Contemporary DRAM memories require a high degree of redundancy (i.e., extra array columns and extra array rows which can be used to replace defective columns and rows) in order to improve manufacturing yields Antifuses have been suggested for use as nonvolatile programmable memory elements to store logic states which would be used in DRAMs for row and column redundancy implementation. An antifuse is, by definition, a device which functions as an open circuit until programmed to be a permanent short circuit. Ideally, antifuses for redundancy implementation would be constructed in the same manner as the cell capacitors in the DRAM array. Although various dielectrics have been utilized in anti-fuses, an oxide-nitride-oxide (ONO) dielectric, optimized as an antifuse able to withstand full power supply voltage (commonly denoted $V_{CC}$) has proven to be very reliable. Oxide-nitride-oxide (ONO) dielectric layers are also commonly used in contemporary DRAMs. It is a well-known fact that once a capacitor in a DRAM cell has been subjected to excessive voltage, it will be permanently unusable due to the development of a resistive short in the capacitor dielectric. As a result of the short, the capacitor will no longer be able to maintain a charge.

Because of the fact that CMOS logic typically requires full power supply voltage, and because the capacitors in contemporary DRAMs are designed to reliably withstand only half the power supply voltage, nonvolatile memory cells constructed with anti-fuses cannot be incorporated in a DRAM memory unless the dielectric layer used in the anti-fuses is thicker than that used in the DRAM cells. A two-thickness dielectric process would add cost to the manufacturing process.

What is needed is a new nonvolatile memory cell which incorporates anti-fuses operable at less than full power supply voltage, and which provides full CMOS output voltage levels. In addition, the new nonvolatile memory cell must make use of ONO dielectric layers which are optimized as capacitor dielectrics, rather than antifuse dielectrics. Such a cell could be utilized not only to implement redundancy in a DRAM array with little or no additional processing steps, but also for the construction of programmable logic devices requiring lower programming voltages.

SUMMARY OF THE INVENTION

This disclosure describes a nonvolatile zero-power memory cell circuit constructed from anti-fuses operable at less than full power supply voltage, and which provides full CMOS output voltage levels. Such a cell may be fabricated utilizing a standard DRAM process that has been optimized for the DRAM memory array. In such an application, the antifuses of the nonvolatile memory cell utilize the standard DRAM capacitor dielectric layer.

The nonvolatile cell comprises a programmable node which is connected to a high voltage line (which during normal operation is at a potential of approximately $V_{CC}/2$) via a first antifuse and to a low voltage line (which during normal operation is at ground potential) via a second antifuse. The programmable node is connectable to ground via a field-effect transistor which is controlled by a programming signal voltage. The programmable node may be permanently connected to the high-voltage line by activating the programming signal and raising the voltage on that line to a voltage that is sufficiently high to cause the dielectric of the first antifuse to short. On the other hand, the programmable node may be permanently connected to the low-voltage line by activating the programming signal and raising the voltage on that line to a voltage level that is sufficiently high to cause the dielectric of the second antifuse to short. In order to provide a CMOS compatible output, the voltage at the programmable node is fed to either a simple voltage translator or to a latch, which boosts $V_{CC}/2$ outputs to $V_{CC}$ (the required voltage for CMOS operation).

PREFERRED EMBODIMENT OF THE INVENTION

Figure 1:
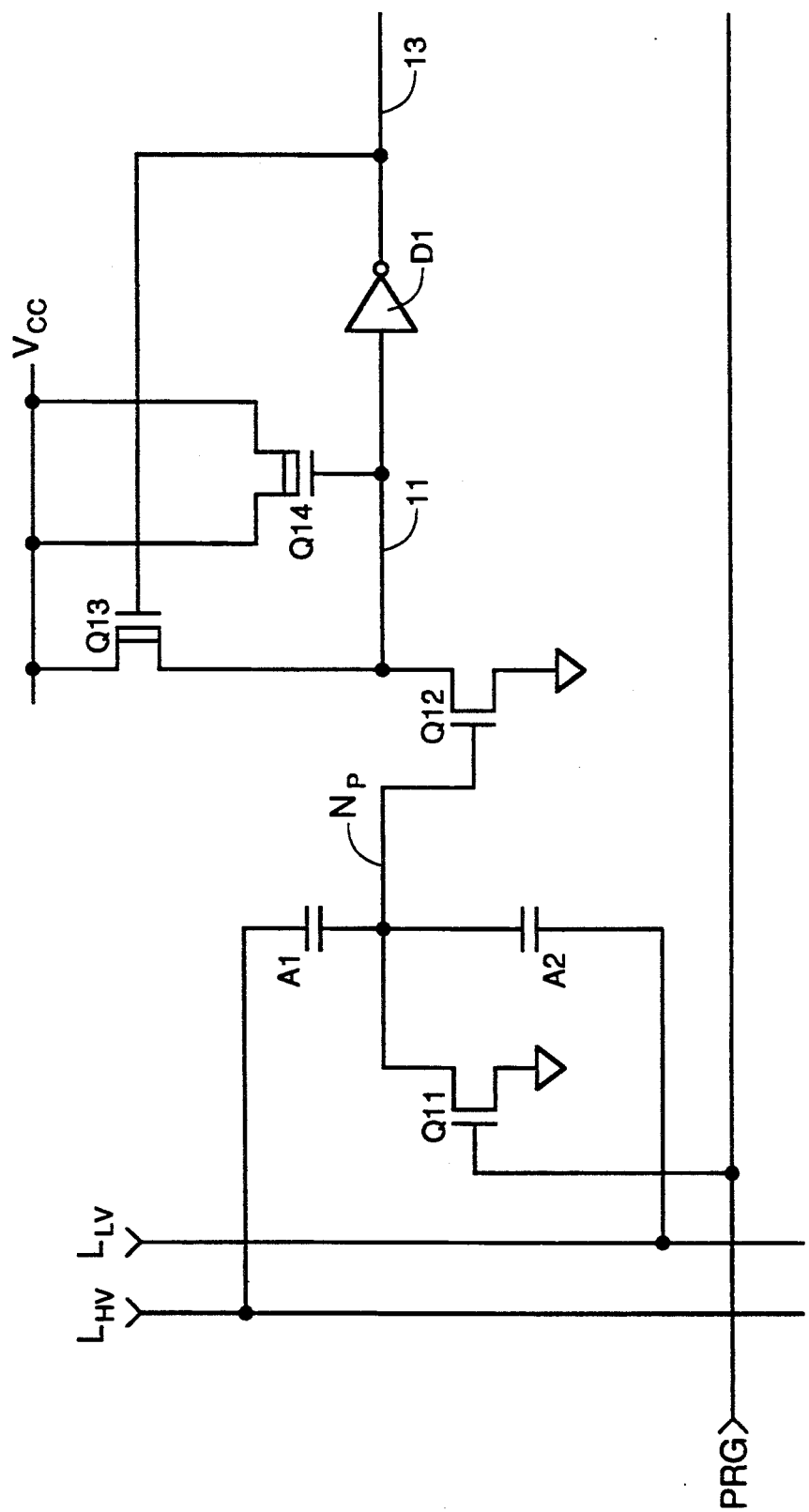
FIG. 1 is a schematic diagram of a first embodiment of the nonvolatile, zero-power memory cell, which utilizes a latch to boost the voltage at the programmable node to a conventional CMOS voltage level.
Figure 2:
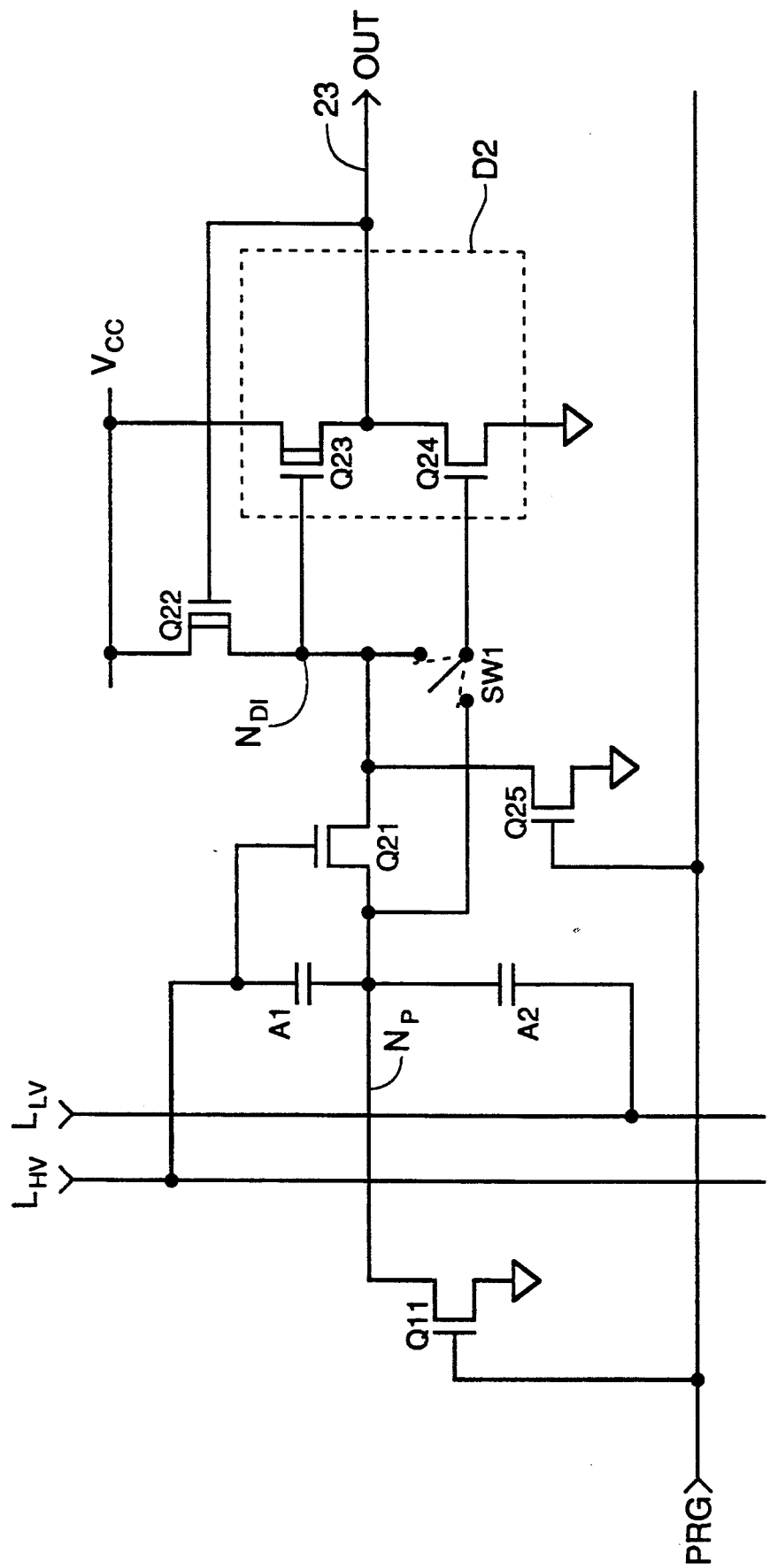
FIG. 2 is a schematic diagram of second and third embodiments of the nonvolatile, zero-power memory cell, which utilize a simple voltage translator to boost the voltage at the programmable node to a conventional CMOS voltage level.

Referring now to FIG. 1, a first embodiment of the nonvolatile, zero-power memory cell comprises a programmable node $N_P$, which is connected to a high voltage line $L_{HV}$ (which during normal operation is at a potential of approximately $V_{CC}/2$) via a first antifuse A1 and to a low voltage line $L_{LV}$ (which during normal operation is at ground potential) via a second antifuse A2. The cell may be programmed by permanently connecting programmable node $N_P$ to either high voltage line $L_{HV}$ or to low voltage line $L_{LV}$. Connection to high voltage line $L_{HV}$ is made by shorting antifuse A1. Alternatively, connection to low voltage line $L_{LV}$ is made by shorting antifuse A2. Programming of an array of the nonvolatile, zero-power memory cells will be discussed with reference to FIG. 3. At this point, suffice it to say that a first N-channel field-effect transistor (FET) Q11, through which programmable node $N_P$ is connected to ground, is activated in order to program or to test the cell. It will be noted that transistor Q11 is controlled by a programming signal PRG. Since the nonvolatile memory cell of this invention is designed to be incorporated into a standard DRAM fabrication process in which both the DRAM cell capacitors and the antifuses utilize a single standard dielectric layer optimized for DRAM cell capacitance, the antifuses are capable of reliably withstanding a voltage differential of only $V_{CC}/2$. Most contemporary DRAM cells utilize a three-layer sandwich of silicon dioxide, silicon nitride and silicon dioxide (O-N-O) for the capacitor dielectric. Other dielectrics, such as tantalum pentoxide, which have higher dielectric constants than that of the O-N-O sandwich have been used in DRAM prototypes. Due to the fact that CMOS logic typically requires full power supply voltage (i.e., $V_{CC}$), the voltages at programmable node $N_P$ of the memory cell must be translated into CMOS logic compatible voltages. Two techniques are depicted in this disclosure. The first and preferred technique, which is depicted in the circuit of FIG. 1, employs a latching circuit which provides not only the required voltage translation function, but also a reset function at power-on. The second technique, which is depicted in the circuit of FIG. 2, provides only the voltage translation function.

Still referring to FIG. 1, programmable node $N_P$ is also connected to the gate of a second N-channel FET Q12. The source of transistor Q12 is connected directly to ground, while the drain thereof is connected to full power supply voltage $V_{CC}$ through a first P-channel FET Q13. The drain of transistor Q12 is also connected to the gate of a second P-channel FET Q14 and to the input of a CMOS inverting driver D1. Both the source and drain of transistor Q14 are tied to $V_{CC}$, so that transistor Q14 functions merely as a capacitor. On power-up, Q14 capacitively pulls up node 11 to a high voltage, and inverter D1 will thus have a low voltage output on node 13. With node 13 low, transistor Q13 will be activated and thus maintain node 11 high indefinitely, as long as Q12 is never activated. The output of driver D1 equals the logic value stored within the cell at a full CMOS voltage level.

As a matter of clarification, it should be mentioned that in its simplest form, driver D1 (like driver D2 of FIG. 2) may be constructed from a P-channel driver FET and an N-channel driver FET. For the first embodiment of the nonvolatile memory cell depicted in FIG. 1, the input to driver D1 is tied to the gates of both driver FETs, whereas the output thereof is tied to $V_{CC}$ via the P-channel driver FET, and to ground via the N-channel driver FET.

Testability is essential for screening programmable logic devices to ensure that the device is programmable by the end user. Still referring to FIG. 1, it should be noted that the nonvolatile, zero-power memory cell may be functionally tested prior to programming. It can be assumed that the in-specification ratio of the capacitance of antifuse A1 to that of A2 is known. The test begins with power applied to all Vhd CC inputs so that node 11 is at a high voltage state, with lines $L_{HV}$ and $L_{LV}$ grounded, and Q11 turned "ON" to ensure that node $N_P$ is initially at ground potential. The test proceeds by, first, turning off transistor Q11, and then raising the voltage level on $L_{HV}$ until the threshold voltage of transistor Q12 is exceeded. The voltage level at which transistor Q12 is turned "ON" will be related to the actual capacitance ratio of antifuse A1 to antifuse A2. If the capacitance ratio is outside an acceptable range, the triggering voltage level will reflect this variance. Current leakage through an antifuse dielectric layer, on the other hand, may be detected by slowly ramping the voltage on line $L_{HV}$ at a known rate. If the dielectric layer of antifuse A1 is leaky, then the data state of the cell (i.e., the cell output at node 13) will be tripped prematurely. Conversely, if the dielectric layer of antifuse A2 is leaky, the data state of the cell will be prevented from tripping altogether.

Still referring to FIG. 1, the normal operation of the cell following programming will now be described. High voltage line $L_{HV}$ is maintained at a potential of $V_{CC}/2$, while low voltage line $L_{LV}$ is maintained at ground potential. With programming signal PRG deactivated, transistor Q11 remains non-conductive. If the cell has been programmed such that antifuse A1 is shorted, at power up, the programmable node will go to approximately $V_{CC}/2$ and turn on transistor Q12, causing the cell output to go to $V_{CC}$. If, on the other hand, the cell has been programmed such that antifuse A2 is shorted, at power up, programmable node $N_P$ will remain at ground and transistor Q12 will remain "OFF", leaving the cell output at ground potential. The cell is designed so as to function over a wide range of resistance through a programmed antifuse Even given a resistance range of 100 to 1,000,000,000 ohms, normal cell operation is feasible. For example, even if the programmed resistance of antifuse A2 is on the order of 1,000,000,000 ohms, and assuming that ramping of voltage on high voltage line $L_{HV}$ at power up is limited to approximately 1-2 millivolts per microsecond, the programmed resistance on antifuse A2 will be adequate to maintain programmed node $N_P$ close to ground potential, and the cell will operate properly.

Referring now to FIG. 2, second and third embodiments of the nonvolatile zero-power memory cell are depicted, which are similar to the first embodiment described above, in that they, too, have a programmable node $N_P$, which is connected to a high voltage line $L_{HV}$ (which during normal operation is at a potential of approximately $V_{CC}/2$) via a first antifuse A1 and to a low voltage line $L_{LV}$ (which during normal operation is at ground potential) via a second antifuse A2. As with the first embodiment, the cell is programmed by permanently connecting programmable node $N_P$ to either high voltage line $L_{HV}$ or to low voltage line $L_{LV}$. Connection to high voltage line $L_{HV}$ is made by shorting antifuse A1. Alternatively, connection to low voltage line $L_{LV}$ is made by shorting antifuse A2. The second and third embodiments of the cell also have a first N-channel FET Q11, which is utilized during the programming procedure to connect programmable node $N_P$ to ground. It will be noted that transistor Q11 is also controlled by programming signal PRG.

Still referring to FIG. 2, the second and third embodiments of the nonvolatile, zero-power memory cell differ from the first embodiment primarily in the circuitry used to convert the voltage at the programmable node to voltage states that are CMOS logic compatible. As in the first embodiment of the cell, an inverting CMOS driver (driver D2 in the case of the second embodiment) provides full CMOS output voltage levels for the cell. Driver D2 is comprised of P-channel driver FET Q23 and an N-channel driver FET Q24. For the second embodiment of the cell, which is represented by the contact of switch SW1 being in a vertical position, a second N-channel FET Q21 is connected between programmable node $N_P$ and the driver input node $N_{D1}$, to which the gates of both P-channel driver FET Q23 and N-channel driver FET Q24 are tied, connection to the gate of FET Q24 being made through switch SW1. The gate of FET Q21 is connected to high-voltage line $L_{HV}$. The function of FET Q21 is to prevent full $V_{CC}$ potential that may be on driver input node $N_{DI}$ from bleeding back to programmable node $N_P$. A power reduction P-channel FET Q22 is connected between $V_{CC}$ and both inputs of driver D2. The output of driver D2 is fed back to the gate of FET Q22. When the output node of driver D2 changes from a high to a low state, FET Q22 switches on to provide full $V_{CC}$ voltage level at the inputs of driver D2. This feature prevents any significant current flow to ground through FETs Q23 and Q24 when programmable node $N_P$ is high by completely turning off driver transistor Q23. In order to promote proper switching of the circuit by lowering the input voltage trip point of inverter D2, FET Q24 is made at least twice the size of FET Q23. The third embodiment of the cell is represented by the contact of switch SW1 being in a horizontal position. For this embodiment, the gate of driver transistor Q24 is connected directly to node $N_P$. The operation of the third embodiment is similar to that of the second embodiment, except that the cell may be operated at lower supply voltages, since the threshold drop of transistor Q21 is eliminated. For both the second and third embodiments of the cell, the channel of N-channel initialization FET Q25 grounds the node, to which the drain of FET Q22 and the gate of FET Q23 are connected, when signal PRG is high.

The second and third embodiments of the nonvolatile zero-power memory cell of FIG. 2 may be tested in a manner similar to that used to test the first embodiment cell of FIG. 1. Once again, it is assumed that the in-specification ratio of the capacitance of antifuse A1 to that of A2 is known. The test begins with power applied to all $V_{CC}$ inputs, with lines $L_{HV}$ and $L_{LV}$ grounded, and both FET Q11 and FET Q25 turned "ON" to ensure that node $N_P$ and the inputs to driver D2 are initially at ground potential. With the inputs to driver D2 at ground potential, the output of inverter D2 will be at a high level (i.e., $V_{CC}$). The test proceeds, first by turning off transistors Q11 and Q25, and then raising the voltage level on high voltage line $L_{HV}$ until the threshold voltage of transistor Q24 is exceeded sufficiently to switch the output of inverter D2 to a low logic level (i.e., ground potential). The voltage level at which switching of the output of driver D2 occurs will be related to the actual capacitance ratio of antifuse A1 to antifuse A2. If the capacitance ratio is outside an acceptable range, the switching voltage level will reflect this variance. Current leakage through an antifuse dielectric layer, on the other hand, may be detected by slowly ramping the voltage on line $L_{HV}$ at a known rate. If the dielectric layer of antifuse A1 is leaky, then the data state of the cell (i.e., the cell output at node 23) will switch prematurely. Conversely, if the dielectric layer of antifuse A2 is leaky, the data state of the cell will be prevented from switching altogether.

Figure 3:
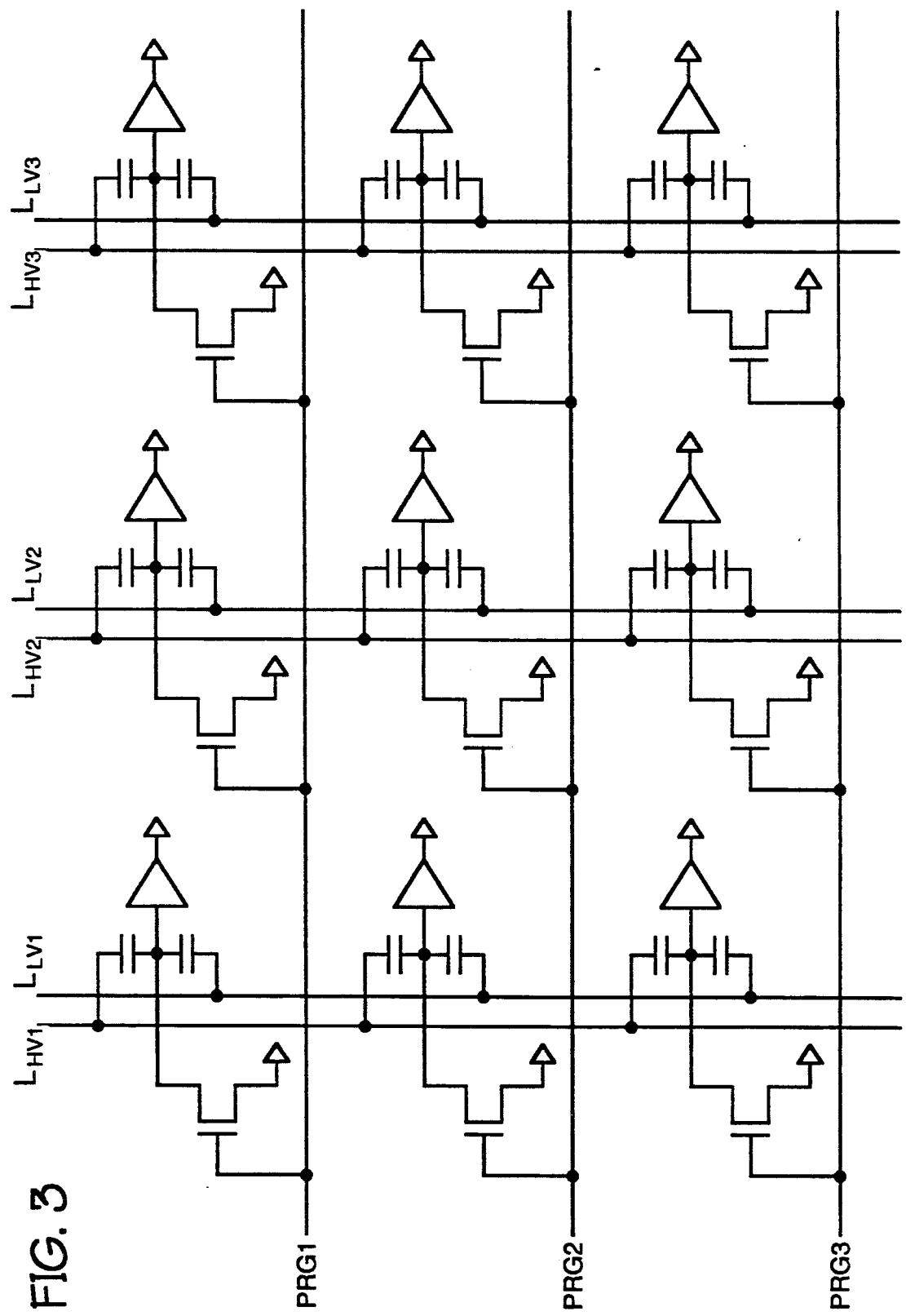
FIG. 3 is a schematic diagram of an array of nonvolatile, zero-power memory cells.

Referring now to FIG. 3, any of the three embodiment of the non-volatile, zero-power memory cell are shown a repeating element of a 3×3 nonvolatile memory cell array. Three sets of low and high voltage lines ($L_{LV1}/L_{HV1}$, $L_{LV2}/L_{HV2}$, and $L_{LV3}/L_{HV3}$( are shown, as are three programming signal lines PRG1, PRG2, and PRG3. One row of the array may be programmed at a time In order to execute the programming of one row, all low and high voltage lines are first brought to approximately one-half of a programming voltage ($V_{PRG}$). Then the appropriate low or high voltage line of each low and high voltage line pair is brought to $V_{PRG}$. Voltage $V_{PRG}$ is sufficient to cause electrical breakdown of the desired antifuse. For contemporary DRAM oxide-nitride-oxide dielectrics, $V_{PRG}$ will be approximately 10-12 volts. For most applications, $V_{PRG}$ will be equal to approximately twice the standard power supply voltage $V_{CC}$. It will be noted that antifuses within cells that are not programmed are never stressed with more than half $V_{PRG}$. When the programming signal for the row to be programmed is activated, the appropriate antifuse of each cell within the row will be shorted, thus resulting in a permanent memory state for that particular cell. Once the row of cells is programmed, the programming signal line is deactivated, and programming of other rows proceeds in a like manner. Once the entire array is programmed, the normal operating voltages of approximately $V_{CC}/2$ and ground are used on the high voltage and low voltage lines, respectively, within the array. The 3×3 array may be expanded in either direction, and thus the nonvolatile memory cell may be utilized in programmable logic devices.

Figure 4:
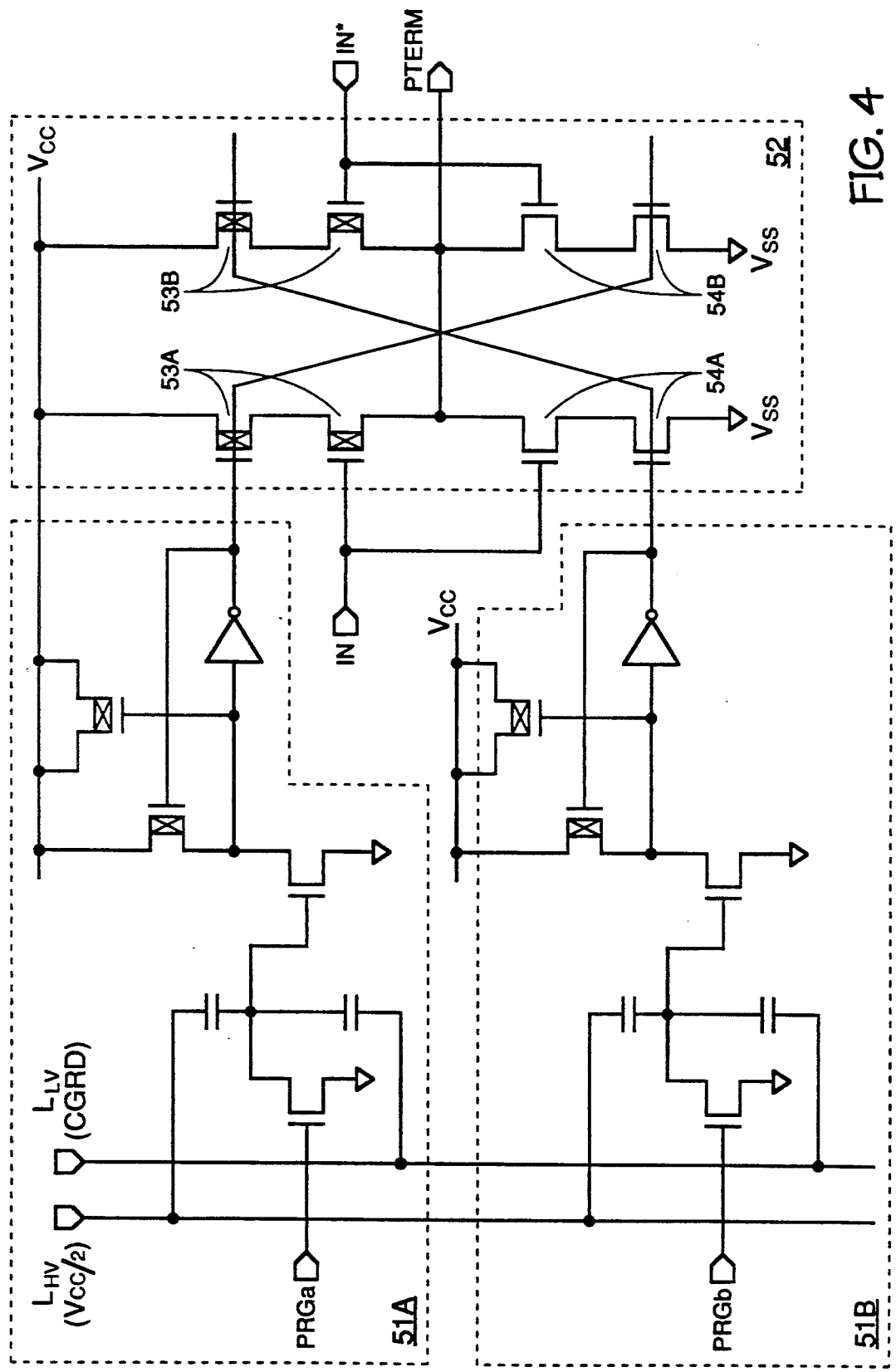
FIG. 4 is a schematic diagram of a pair of nonvolatile, zero-power memory cells in combination with a high-speed, zero power logic cell.

Referring now to FIG. 4, first and second nonvolatile, zero-power memory cells (51A and 51B, respectively) are shown in combination with a high-speed, zero power logic cell 52, which may be used to construct programmable logic devices such as programmable array logic devices (PALs) and field programmable logic arrays (FPLAs). The logic cell 52 is constructed from first and second pairs of P-channel FETs (53A and 53B, respectively), and first and second pairs of N-channel FETs (54A and 54B, respectively). Each pair of P-channel FETS is connected in series between an output node and $V_{CC}$, while each pair of N-channel FETS is connected in series between the output node and $V_{SS}$ (i.e., ground). The gate of one transistor of the first P-channel FET pair is connected to the output of a first memory cell, while the gate of the other transistor of the same pair is connected to an input signal IN; the gate of one transistor of the second P-channel FET pair is connected to the output of a second memory cell, while the gate of the other transistor of the same pair is connected to signal IN*. Likewise, the gate of one transistor of the first N-channel FET pair is connected to the output of the second memory cell 51B, while the gate of the other transistor of the same pair is connected to signal IN; the gate of one transistor of the second N-channel FET pair is connected to the output of the first memory cell 51A, while the gate of the other transistor of the same pair is connected to signal IN*. The cell output, or product term (PTERM), is dependent on the values programmed into memory cells 51A and 51B. The logic cell depicted in this figure is the subject of a copending U.S. Pat. application entitled "CMOS Logic Cell for High-Speed, Zero-Power Programmable Array Logic Devices", which was filed on Jan. 6, 1992, accorded the serial number 07/817,167, and incorporated herein by reference.

Although only three embodiments of the nonvolatile, zero-power memory cell have been disclosed herein, it will be evident to those having ordinary skill in the art of semiconductor device design and manufacture that changes and modifications may be made thereto without departing from the invention as claimed.

I claim:

1. A one-time, shortable-element programmable, nonvolatile, zero-power memory cell comprising:
   a programmable node;
   a first antifuse connected between said programmable node and a high-voltage line, said high-voltage line being at a potential during normal operation which is less than a power supply voltage, said power supply voltage being equivalent to a high CMOS logic level;
   a second antifuse connected between said programmable node and a low-voltage line, said low-voltage line being at a potential during normal operation which corresponds to ground potential;
   a first field-effect transistor (FET) through which said programmable node may be set to ground potential; and
   a voltage translator circiut for converting the voltages at said programmable node to CMOS low and high logic levels.

2. The nonvolatile memory cell of claim 1, wherein said first and second antifuses each utilize a dielectric layer which cannot reliably withstand the full voltage differential between said high and low CMOS logic levels.

3. The nonvolatile memory cell of claim 1, wherein the channel of said first FE is essentially non-conductive during normal operation of the nonvolatile cell, being made conductive during a programming sequence in response to the application of a programming signal applied to the gate thereof.

4. The nonvolatile memory cell of claim 1, wherein the operational voltage of said high-voltage line is approximately half the power supply voltage, which is commonly denoted $V_{CC}/2$.

5. The nonvolatile memory cell of claim 3, wherein said first FET is an N-channel device.

6. The nonvolatile memory cell of claim 3, wherein during a programming sequence both said high-voltage line and said low-voltage line are switchable between a programming voltage and a standby voltage, said programming voltage being sufficient to short the dielectric of either said first or said second antifuse when said programmable node is brought to ground potential, and said standby voltage being approximately equal to half the programming voltage.

7. The nonvolatile memory cell of claim 1, wherein said cell is one of multiple identical cells incorporated in a dynamic random access memory chip for the purpose of storing logic states related to the implementation of row redundancy within the dynamic random access memory array.

8. The nonvolatile memory cell of claim 7, wherein said first and second antifuses utilize a dielectric layer that is optimized for the dielectric layer of dynamic random access memory cell capacitors.

9. The nonvolatile memory cell of claim 1, wherein said cell is one of multiple identical cells incorporated in a dynamic random access memory chip for the purpose of storing logic states related to the implementation of column redundancy within the dynamic random access memory array.

10. The nonvolatile memory cell of claim 9, wherein said first and second antifuses utilize a dielectric layer that is optimized for the dielectric layer of dynamic random access memory cell capacitors.

11. The nonvolatile memory cell of claim 1, wherein said cell is one of multiple identical cells incorporated in a dynamic random access memory chip for the purpose of storing logic states related to the implementation of row and column redundancy within the dynamic random access memory array.

12. The nonvolatile memory cell of claim 11, wherein said first and second antifuses utilize a dielectric layer that is optimized for the dielectric layer of dynamic random access memory cell capacitors.

13. The nonvolatile memory cell of claim 1, wherein said dielectric layer is a silicon dioxide-silicon nitride-silicon dioxide sandwich.

14. The nonvolatile memory cell of claim 1, wherein said dielectric layer is tantalum pentoxide.

15. The nonvolatile memory cell of claim wherein said cell is one of multiple identical cells incorporated in a programmable logic device.

16. The nonvolatile memory cell of claim 1, wherein said voltage translator circuit comprises:
   a second N-channel FET, the gate of which is coupled to said programmable node, and the source of which is coupled to ground;
   a first P-channel FET, the source of which is coupled to full power supply voltage ($V_{CC}$), and the drain of which is coupled to the drain of said second N-channel FET; and
   an inverting CMOS driver, the input of which is coupled to the drain of said first P-channel FET and to the drain of said second N-channel FET; the output of said inverting driver providing a CMOS-logic-compatible cell output which is coupled to the gate of said first P-channel FET.

17. The nonvolatile memory cell of claim 16, which further comprises a second P-channel FET, the source and drain of
   which are both coupled to $V_{CC}$, and the gate of which is coupled to the input of said inverting driver, to the source of said first P-channel FET and to the drain of said second N-channel FET 18. The nonvolatile memory cell of claim 17, wherein said cell may be subjected to a test sequence in order to determine whether or not the ratio of the capacitance of said first antifuse to that of said second antifuse meets a full-specification capacitance ratio of said first antifuse to said antifuse, said test sequence consisting of the following sequence of steps:
   (a) applying power to all $V_{CC}$ inputs so that the input node of the inverting driver is at a high voltage state;
   (b) grounding said low-voltage and said high-voltage lines, simultaneously turning on said first N-channel FET to place the programmable node at ground potential;
   (c) turning off said first N-channel FET;
   (d) raising the voltage level on said high-voltage line until the threshold voltage of said second N-channel FET is exceeded; and (e) comparing the voltage level at which said second N-channel FET is turned on with a known, full-specification value.

19. The nonvolatile memory cell of claim 17, wherein said cell may be subjected to a test sequence in order to determine whether or not the cell exhibits current leakage through an antifuse dielectric layer, said test sequence comprising the following sequence of steps:
(a) applying power to all $V_{CC}$ inputs so that the input node of the inverting driver is at a high voltage state and the cell output at a low CMOS logic level;
(b) grounding said low-voltage and said high-voltage lines, simultaneously turning on said first N-channel FET to place the programmable node at ground potential;
(c) ramping the voltage on line $L_{HV}$ at a known rate;
(d) determining the time required for the data state of the cell to change to the opposite state; and
(e) comparing said time required for change of data state with a known full-specification value.

20. The nonvolatile memory cell of claim 1 wherein said voltage translator circuit comprises:
an inverting CMOS driver comprising an input node, an output node coupled to both $V_{CC}$ via a P-channel driver FET, and to ground via an N-channel driver FET, the gates of both driver FETs being coupled to said input node;
a second N-channel FET, the gate of which is coupled to said high-voltage line, and the channel of which is series coupled between said programmable node and said input node;
a P-channel power-reduction FET, the source of which is coupled to $V_{CC}$, the drain of which is coupled to the gates of both driver FETs, and the gate of said power-reduction FET being coupled to the output node of said inverting driver.

21. The nonvolatile memory cell of claim 20, which further comprises a current path from said input node to ground, said current path existing only in response to a programming signal.

22. The nonvolatile memory cell of claim 21, wherein said current path is implemented with an N-channel initialization FET gated by said programming signal 23. The nonvolatile memory cell of claim 20, wherein said N-channel driver FET is at least twice the size of said P-channel driver FET.

24. The nonvolatile memory cell of claim 22, wherein said cell may be subjected to a test sequence in order to determine whether or not the ratio of the capacitance of said first antifuse to that of said second antifuse meets a full-specification capacitance ratio of said first antifuse to said antifuse, said test sequence consisting of the following sequence of steps:
(a) applying power to all $V_{CC}$ inputs;
(b) grounding said low-voltage and said high-voltage lines, turning on said first N-channel FET to place the programmable node at ground potential and turning on said initialization FET to place the input node of the inverting driver at a low voltage state and the cell output at a high CMOS logic level;
(c) turning off said first N-channel FET and said initialization FET;
(d) raising the voltage level on said high-voltage line until the threshold voltage of said N-channel driver FET is exceeded sufficiently to switch the cell output to a low CMOS logic level; and
(e) comparing the voltage level at which said second N-channel FET is turned on with a known, full-specification value.

25. The nonvolatile memory cell of claim 22, wherein said cell may be subjected to a test sequence in order to determine whether or not the cell exhibits current leakage through an antifuse dielectric layer, said test sequence comprising the following sequence of steps:
(a) applying power to all $V_{CC}$ inputs;
(b) grounding said low-voltage and said high-voltage lines, turning on said first N-channel FET to place the programmable node at ground potential, and turning on said initialization FET to place the input node of the inverting driver at a low voltage state and the cell output at a high CMOS logic level;
(c) turning off said first N-channel FET and said initialization FET;
(d) ramping the voltage on said high-voltage line at a known rate;
(e) determining the time required for the data state of the cell to change to the opposite state; and
(f) comparing said time required for change of data state with a known full-specification value 26. The nonvolatile memory cell of claim 1, wherein said voltage translator circuit comprises:
an inverting CMOS driver comprising an output node coupled to both $V_{CC}$ via a P-channel driver FET, and to ground via an N-channel driver FET, the gate of which is coupled to said programmable node;
a second N-channel FET, the gate of which is coupled to said high-voltage line, and the channel of which is series coupled between said programmable node and the gate of said P-channel driver FET; and
a P-channel power-reduction FET, the source of which is coupled to $V_{CC}$, the drain of which is coupled to the gate of said P-channel driver FET, and the gate of which is coupled to the output node of said inverting CMOS driver.

27. The nonvolatile memory cell of claim 26, which further comprises a current path from the gate of said P-channel driver FET to ground, said current path existing only in response to a programming signal.

28. The nonvolatile memory cell of claim 27, wherein said current path is implemented with an N-channel initialization FET gated by said programming signal.

29. The nonvolatile memory cell of claim 28, wherein said N-channel driver FET at least twice the size of said P-channel driver FET.

30. The nonvolatile memory cell of claim 28, wherein said cell may be subjected to a test sequence in order to determine whether or not the ratio of the capacitance of said first antifuse to that of said second antifuse meets a full-specification capacitance ratio of said first antifuse to said antifuse, said test sequence consisting of the following sequence steps:
(a) applying power to all $V_{CC}$ inputs;
(b) grounding said low-voltage and said high-voltage lines, turning on said first N-channel FET to place both the programmable node and the gate of said N-channel driver FET at ground potential, and turning on said initialization FET to place the gate of said P-channel driver FET at ground potential, the cell output at a high CMOS logic level;
(c) turning off said first N-channel FET and said initialization FET;

(d) raising the voltage level on said high-voltage line until the threshold voltage of said N-channel driver FET is exceeded sufficiently to switch the cell output to a low CMOS logic level; and (e) comparing the voltage level at which said second N-channel FET is turned on with a known, full-specification value.

31. The nonvolatile memory cell of claim 28, wherein said cell may be subjected to a test sequence in order to determine whether or not the cell exhibits current leakage through an antifuse dielectric layer, said test sequence comprising the following sequence of steps:

(a) applying power to all $V_{CC}$ inputs;

(b) grounding said low-voltage and said high-voltage lines, turning on said first N-channel FET to place both the programmable node and the gate of said N-channel driver FET at ground potential, and turning on said initialization FET to place the gate of said P-channel driver FET at ground potential, the cell output at a high CMOS logic level (c) turning off said first N-channel FET and said initialization FET;

(d) ramping the voltage on said high-voltage line at a known rate;

(e) determining the time required for the data state of the cell to change to the opposite state; and (f) comparing said time required for change of data state with a known full-specification value.

* * * * *

UNITED STATES PATENT AND TRADEMARK OFFICE
CERTIFICATE OF CORRECTION

PATENT NO. : 5,148,391
DATED : September 15, 1992
INVENTOR(S) : Paul S. Zagar

It is certified that error appears in the above-identified patent and that said Letters Patent is hereby corrected as shown below:

Column 1, line 35, after "yields " kindly insert -- . --.

Column 4, line 3, kindly delete "Vhd CC" and insert -- $V_{CC}$ --.

Column 5, line 12, kindly delete "$N_{D1}$" and insert -- $N_{DI}$ --.

Column 6, line 12, after "time " kindly insert -- . --.

Column 7, line 29, kindly delete "circiut" and insert -- circuit --.

Column 7, line 38, kindly delete "FE" and insert -- FET --.

Column 8, line 50, after "FET " kindly insert -- . --.

Column 12, line 5, after "level " kindly insert -- ; --.

Signed and Sealed this

Seventeenth Day of May, 1994

Attest:

BRUCE LEHMAN

*Attesting Officer*   Commissioner of Patents and Trademarks